(12) United States Patent
Sun et al.

(10) Patent No.: US 8,564,049 B2
(45) Date of Patent: Oct. 22, 2013

(54) FLIP CHIP CONTACT (FCC) POWER PACKAGE

(75) Inventors: Ming Sun, Sunnyvale, CA (US); Kai Liu, Sunnyvale, CA (US); Xiao Tian Zhang, San Jose, CA (US); Yueh Se Ho, Sunnyvale, CA (US); Leeshawn Luo, Santa Clara, CA (US)

(73) Assignee: Alpha & Omega Semiconductor Incorporated, Sunnyvale, CA (US)

( * ) Notice: Subject to any disclaimer, the term of this patent is extended or adjusted under 35 U.S.C. 154(b) by 63 days.

(21) Appl. No.: 11/894,240

(22) Filed: Mar. 31, 2008

(65) Prior Publication Data

US 2008/0211070 A1    Sep. 4, 2008

Related U.S. Application Data

(63) Continuation of application No. 11/027,081, filed on Dec. 31, 2004, now abandoned, which is a continuation-in-part of application No. 10/996,561, filed on Nov. 23, 2004, now abandoned.

(51) Int. Cl.
*H01L 29/66* (2006.01)

(52) U.S. Cl.
USPC ............................................ 257/329; 257/600

(58) Field of Classification Search
USPC ................. 257/329, 666, E23.044; 438/270
See application file for complete search history.

(56) References Cited

U.S. PATENT DOCUMENTS

| | | | |
|---|---|---|---|
| 6,169,920 B1 * | 1/2001 | Haak et al. | 604/20 |
| 6,249,041 B1 * | 6/2001 | Kasem et al. | 257/666 |
| 6,249,061 B1 * | 6/2001 | Roberts et al. | 307/10.3 |
| 6,368,920 B1 * | 4/2002 | Beasom | 438/270 |
| 6,455,925 B1 | 9/2002 | Laureanti | |
| 6,777,800 B2 | 8/2004 | Madrid et al. | |
| 6,784,537 B2 * | 8/2004 | Moriguchi | 257/706 |
| 6,919,644 B2 | 7/2005 | Uchida | |
| 2001/0052535 A1 * | 12/2001 | Zhu et al. | 228/121 |
| 2002/0033541 A1 * | 3/2002 | Uchida | 257/784 |
| 2004/0036121 A1 * | 2/2004 | Aoki et al. | 257/365 |

FOREIGN PATENT DOCUMENTS

JP    2002-76254    *    3/2002

* cited by examiner

*Primary Examiner* — Howard Weiss
*Assistant Examiner* — Steven Rao
(74) *Attorney, Agent, or Firm* — Bo-In Lin

(57) ABSTRACT

This invention discloses a power device package for containing, protecting and providing electrical contacts for a power transistor. The power device package includes a top and bottom lead frames for directly no-bump attaching to the power transistor. The power transistor is attached to the bottom lead frame as a flip-chip with a source contact and a gate contact directly no-bumping attaching to the bottom lead frame. The power transistor has a bottom drain contact attaching to the top lead frame. The top lead frame further includes an extension for providing a bottom drain electrode substantially on a same side with the bottom lead frame. In a preferred embodiment, the power device package further includes a joint layer between device metal of source, gate or drain and top or bottom lead frame, through applying ultrasonic energy. In another embodiment, a layer of conductive epoxy or adhesive, a solder paste, a carbon paste, or other types of attachment agents for direct no-bumping attaching the power transistor to one of the top and bottom lead frames.

18 Claims, 8 Drawing Sheets

FLIP CHIP CONTACT (FCC) POWER PACKAGE

This application is a Continuation Application of a co-pending application Ser. No. 11/027,081 filed on Dec. 31, 2004 by a common inventor of this Application. Application Ser. No. 11/027,081 is a Continuation-in-Part Application of application Ser. No. 10/996,561 filed on Nov. 23, 2004.

BACKGROUND OF THE INVENTION

1. Field of the Invention

The invention relates generally to the semiconductor devices. More particularly, this invention relates to a novel and improved manufacture method and device configuration for achieve low cost package of a semiconductor device such as a power device comprising metal-oxide semiconductor field effect transistors (MOSFET) chips.

2. Description of the Prior Art

Conventional techniques for containing and protecting a chip formed as an integrated circuit (IC) device in a package are confronted with several limitations. First limitation is the areas that such package occupies is several times larger than the IC chip. The size of the package thus imposes a limitation on the miniaturization of the electronic devices that implement such package. Furthermore, the cost of conventional chip packaging is relatively high due to the fact that each chip must be individually processed applying the single device handling techniques.

Specific example of conventional package of a semiconductor device is the wire-bonding package of a power MOSFET device. The packaging processes are consuming and costly. The extra wire connections further increase the resistance and reduce the performance and meanwhile generate more heat during device operations. In order to overcome such difficulties and limitations, many prior art patents disclose different configuration and packaging processes to reduce the size and cost of manufacturing. Many of such prior art disclosures further provide methods and device configurations to improve the performance characteristics by reducing the resistance and inductance of connections.

In U.S. Pat. No. 6,166,434, entitled "Die Chip Assembly for Semiconductor Package", Desai, et al. disclose a die clip for use in semiconductor flip chip packaging as a replacement for the conventional combination of a heat spreader and stiffener, a packaging method using the die clip, and a semiconductor package incorporating the die clip. In a preferred embodiment, the die clip is a piece of high modulus, high thermal conductivity material shaped to attach over a die on the surface of a packaging substrate. The die clip closely engages the die while leaving some space open around the perimeter to provide access to the die. The packaging configuration as disclosed however cannot be conveniently applied to the power MOSFET chips due to the fact that there are no gate and source paths. The packaging configuration as disclosed would have resistances even higher than the gold or aluminum wires currently implemented for the MOSFET chips. The higher resistances are caused by the small size of the bumps or the balls due to the limitations of the size of the die. Higher resistances are resulted from attachment of small bumps or balls to the board when the bump or balls have very limited contact areas to the board. Furthermore, the packaging configuration as disclosed would make the board level assembly joints difficult to assemble because both the bumps or balls on the flip chips and the cap will have different claps height during the assembly process. Potential problems with board level reliability may arise due to these height differences.

In U.S. Pat. No. 6,624,522, entitled "Chip scale surface mounted device and process of manufacture", Standing, et al. disclose a chip scale package has a semiconductor MOSFET die which has a top electrode surface covered with a layer of a photosensitive liquid epoxy which is photolithographically patterned to expose portions of the electrode surface and to act as a passivation layer and as a solder mask. A solderable contact layer is then formed over the passivation layer. The individual die are mounted drain side down in a metal clip or can with the drain electrode disposed coplanar with a flange extending from the can bottom. The packaging configuration as disclosed however has limited heat dissipation areas. Furthermore, the exposed portions of the electrode surface for soldering contact will result in resistances and inductances that would degrade the performance of the power MOSFET device.

Therefore, a need still exists for those of ordinary skill in the art to provide a new and improved packaging configuration and processing methods such that the above discussed limitations and difficulties can be resolved. Specifically, it is desirable that an improved packaging configuration and processing method is able to achieve low cost, reduce size and improved performance for a power MOSFET device.

SUMMARY OF THE PRESENT INVENTION

It is therefore an object of the present invention to provide a new design and manufacturing methods and device configuration for containing, protecting and providing electrodes for the power MOSFET transistors by directly attaching lead frames to the transistors without requiring a bumping process such that the limitations of the conventional methods can be overcome.

Specifically, it is an object of the present invention to provide a top and bottom lead frame strips each includes multiple lead frames for receiving a multiple power transistors mounted onto the bottom lead frames as a flip chip. The top lead frames are mounted onto the bottom drain contact with electrode extension extending to the bottom lead frame such that the drain, gate and source electrodes are all formed on the same side of the lead frame strip package for conveniently implementation in different kinds of circuit configurations.

Briefly in a preferred embodiment this invention discloses a power device package for containing, protecting and providing electrical contacts for a power transistor. The power device package includes a top and bottom lead frames for directly no-bumping attaching to the power transistor. The power transistor is attached to the bottom lead frame as a flip-chip with a source contact and a gate contact directly no-bumping attaching to the bottom lead frame. The power transistor has a bottom drain contact attaching to the top lead frame. The top lead frame further includes an extension for providing a bottom drain electrode substantially on a same side with the bottom lead frame. In a preferred embodiment, the power device package further includes a layer of direct melting metal joint or conductive epoxy or adhesive, a solder paste, a carbon paste, or other types of attachment agents for direct no-bumping attaching the power transistor to one of the top and bottom lead frames These and other objects and advantages of the present invention will no doubt become obvious to those of ordinary

DETAILED DESCRIPTION OF THE METHOD

Figure 1:
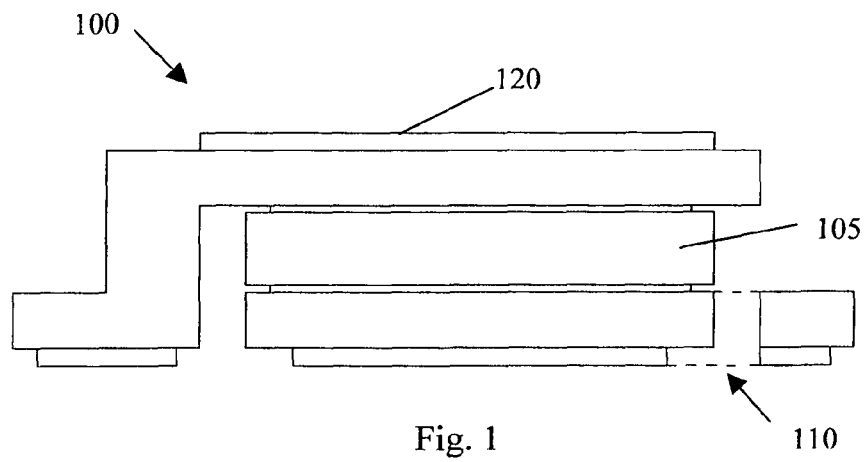
FIG. 1 is a cross sectional view of a power device package assembled with a top and bottom lead frames for direct no bump attachment to the power transistor according to a process of the present invention.

Referring to FIG. 1 for a side cross sectional view of a package 100 for a semiconductor device, e.g., a MOSFET device. The structure of the package 100 includes an IC chip, i.e., a die 105, flips on an electrically conducting lead frame 110. The lead frame is a conducting frame composed of frame plated with Al, Cu, Ag, and Ni or may be any electrically conducting frame. Unlike conventional flip chip configurations, the flip chip 105 is connecting to the lead frame 110 without requiring a prior process to form "bumps" on the IC chip as interconnect. For a MOSFET package, the package 100 comprises three layers. A top conducting-frame 120 is connected to drain of the MOSFET. The MOSFET chip 105 is disposed between the top layer and the bottom layer. The bottom conducting-frame 110 is connected to source and gate of the MOSFET.

Figure 2:
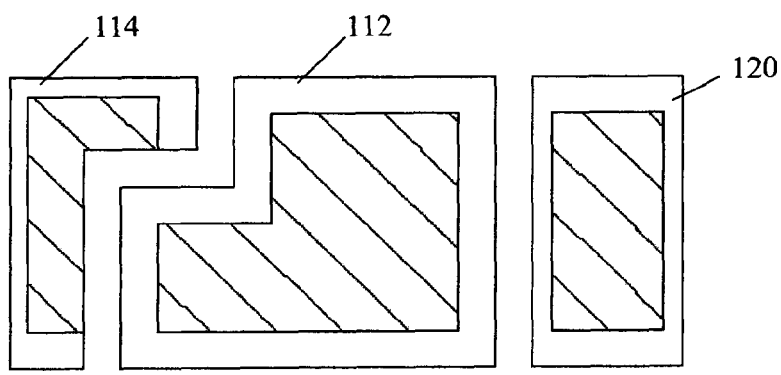
FIGS. 2 and 3A to 3B show the top and bottom views of the power device package of this invention.

FIG. 2 shows the bottom view of the device. The bottom-conducting frame 110 is divided into a source portion 112 and a gate portion 114. When the device is molded with molding compound, only the shaded areas of 112, 114 and 120 will be exposed for contact. For the purpose of enhancing the convenience of applications, the bottom frame 110 can be further configured and wired so that it is ready to directly mount on a printed circuit board (PCB), card, module, etc. The top frame and the bottom can also be arranged in a ninety-degree fashion instead of as shown in FIG. 2. The direct mounting process can be achieved by soldering, adhesive attachment or any kind of technologies available to the existing board level assemblies including the component surface mount (SMT) technologies.

Figures 3A, 3B:
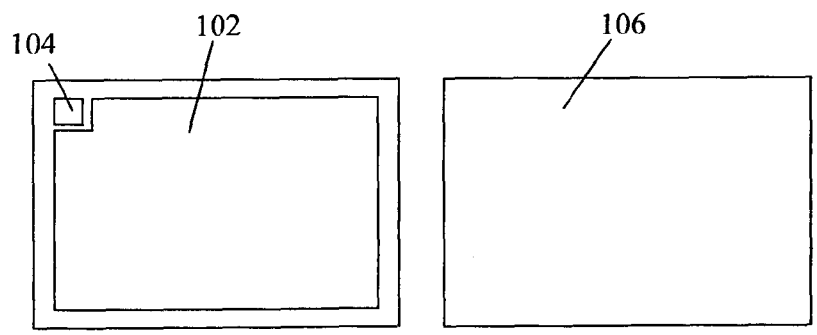

More specifically, the top and bottom conducting frames 120 and 110 may comprise a metal structure or any other low resistance conducting material. The top frame 120 carries a drain current. The bottom frame 110 comprises two electrically separating leads. One of the leads carries a source current and another lead carries a gate control voltage. FIGS. 3A and 3B shows the typical top and bottom surface layout of die 105. Unlike most IC dies where the surface is covered with a passivation layer and contacts are made by ball bumps through the contact holes, die 105 does not have a passivation layer on the surface so that contacts are made directly onto the contact pads on the die surface. On top surface the die has a source pad 102 and a gate pad 104, which are aluminum or other metal contacts that directly connected to the source and gate of the semiconductor structure. The bottom surface has a large drain pad 106.

Figure 4:
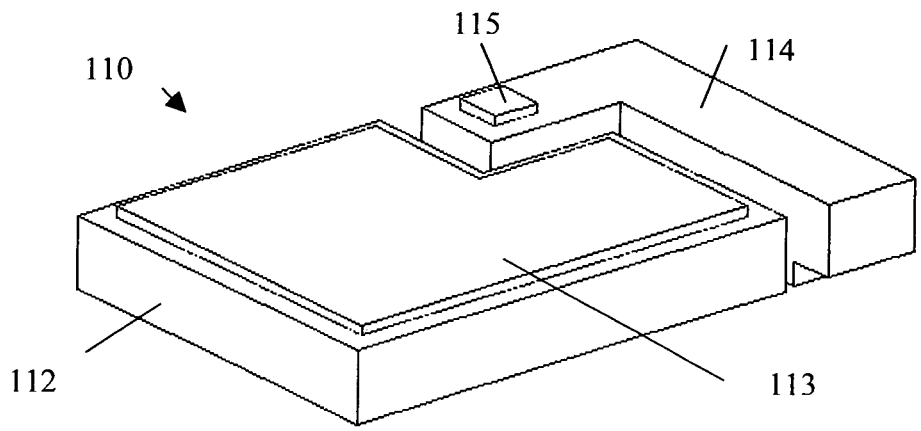
FIGS. 4 and 5 are two perspective views of the power device package of this invention.

FIG. 4 is a perspective view showing the top surface of the bottom frame 110. As mentioned above, the bottom frame 110 is divided into a source portion 112 and a gate portion 114. A step up area 113 on source frame 112 and a step up area 115 on gate frame 114 are configured to match the source pad 102 and gate pad 104 on the die in such a way that when the die 105 flips and rests on the bottom frame, the die source pad 102 is in intimate contact with source step up area 113 and the die gate pad 104 is in intimate contact with gate step up area 115. Thus the source lead frame contacts directly to source active area of chip and gate lead frame contacts directly to gate area of chip to maximize the contact area between chip and lead frame via applying ultrasonic energy, locally heating, conductive epoxy/adhesive, soldering or carbon type connection joints etc. The top frame has the similar step structure therefore can be directly attached to the drain area of chip by means of ultrasonic, locally heating, conductive epoxy/adhesive or soldering etc. With such direct contact, the source and gate related resistances and inductances outside chip with this structure can be minimized significantly. The jointed area between chip and lead frame can be maximized to reduce electrical resistance and the same time, to maximize cooling effect.

Figure 5:
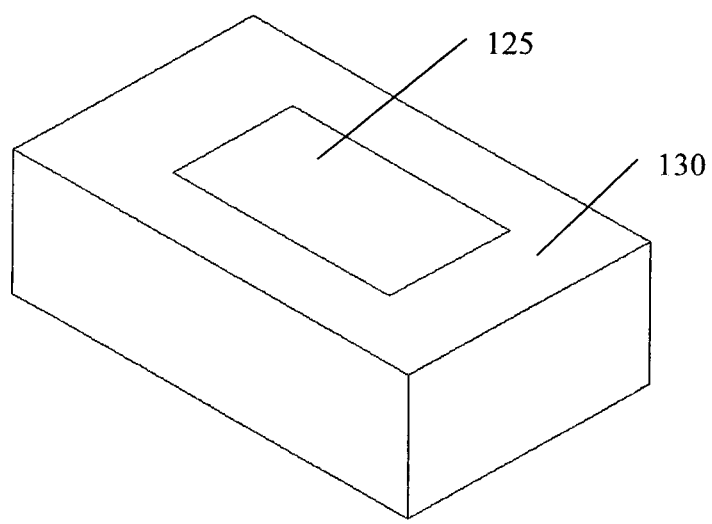

This package is molded with top and bottom frames exposed directly to air, which provides direct heat dissipation windows. The molded package provides the effective mechanical support for package strength and reliability and also chemical protections from moisture and chemical attacks in some severe working environments. FIG. 5 shows a perspective view looking the package from the top with the contact area 125 exposed with the remainder of the surface covered by a molded protection housing 130.

The packaging assembly as disclosed above uses larger metal pads for board level attach, which makes it easier and reliable. The conductive metal frames 120, 112, and 114 are directly attached to die surface, as interface of chip and board. There is no bump or ball between chip 105 and the metal frames 120, 112 and 114 and the board. Significant cost savings are achieved by eliminating the requirements of bump or ball attachment processes. With the packaging configuration as that shown in FIGS. 1 to 5, the packaging structure can be more conveniently implemented as matrix assemblies as will be further described below. Improvements of productivity through units per hour (UPH) and assembly cost are achieved. The packaging configuration as described above further has much lower inductance because shorter distance for current conductions are provided by eliminating the conventional contacting interfaces that use bumps or balls. The use of lead frame for all of board level attachment of source, gate and drain pins makes it easier to be placed on the same height. The package structure has the largest effective heat transfer area, which significantly improves thermal performance of package.

Figure 6A:
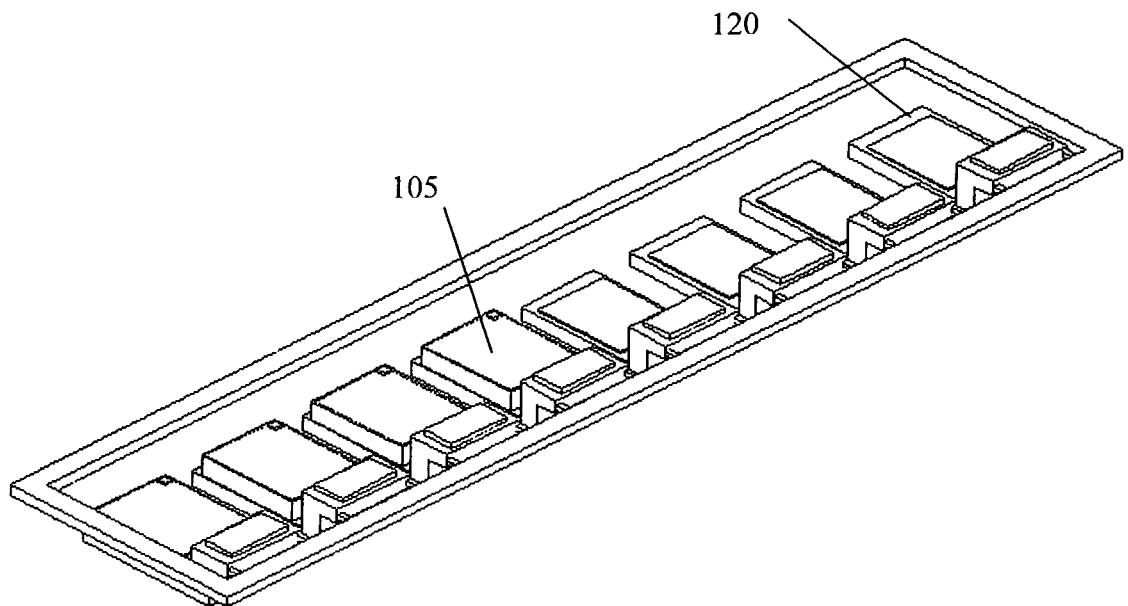
FIGS. 6A to 6C are a serial of perspective views for showing a preferred manufacturing process of a strip of power device package of this invention.
Figure 6B:
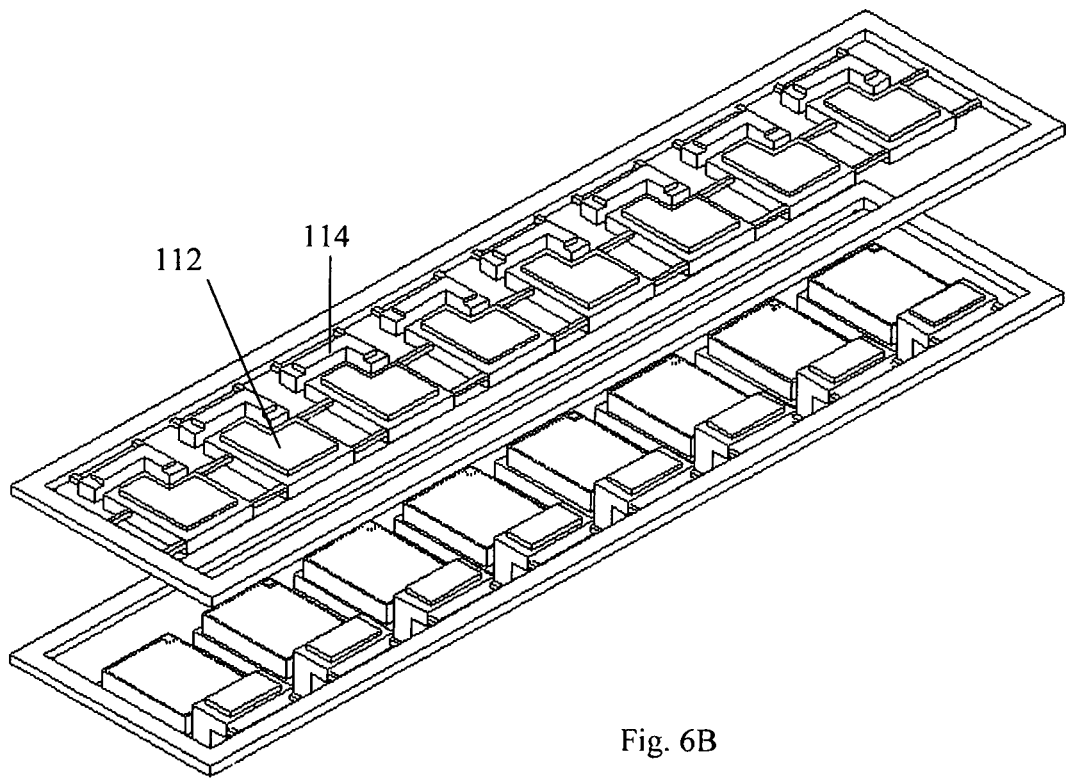
Figure 6C:
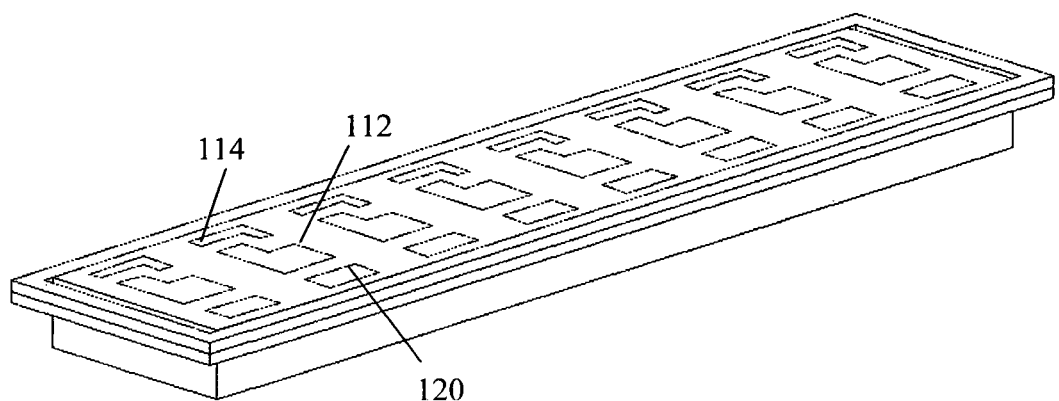

Referring to FIGS. 6A to 6C for a first method to package a strip of MOSFET power devices implemented with packaging configuration as described above. In FIG. 6A, a strip of top lead-frame 120 for contacting the drain of a MOSFET chip 105 is placed upside down on a die attachment machine, e.g., a die bonder (not show). A layer of conductive epoxy/adhesive or solder past 108 (not shown) is deposited on top of the top surface of the chip-pads as part of the lead frame 120. The chip then place onto the supporting pad and attached to the lead frame through epoxy/adhesive, soldering, carbon paste local heating by ultrasonic energy with a bottom application method. In another embodiment no epoxy/adhesive or solder, carbon paste is used, the die is attached to the lead frame through direct metal melting joint by ultrasonic local heating. In FIG. 6B, a bottom lead frame 110 that includes contacts for source 112 and gate 114 are placed to top to contact the source and gate of the chip 105. The top bottom lead frame 110 is attached to the chip by applying ultrasonic energy for local heating or by use of epoxy/adhesive, soldering or carbon paste processes. FIG. 6C shows a bottom view of a strip of power chip package onto the top and bottom lead frames by applying the processes described above with gate contact 114, source contact 114 and drain contact 120 exposed and ready for mounting and implementation into circuits for various applications.

Figure 7A:
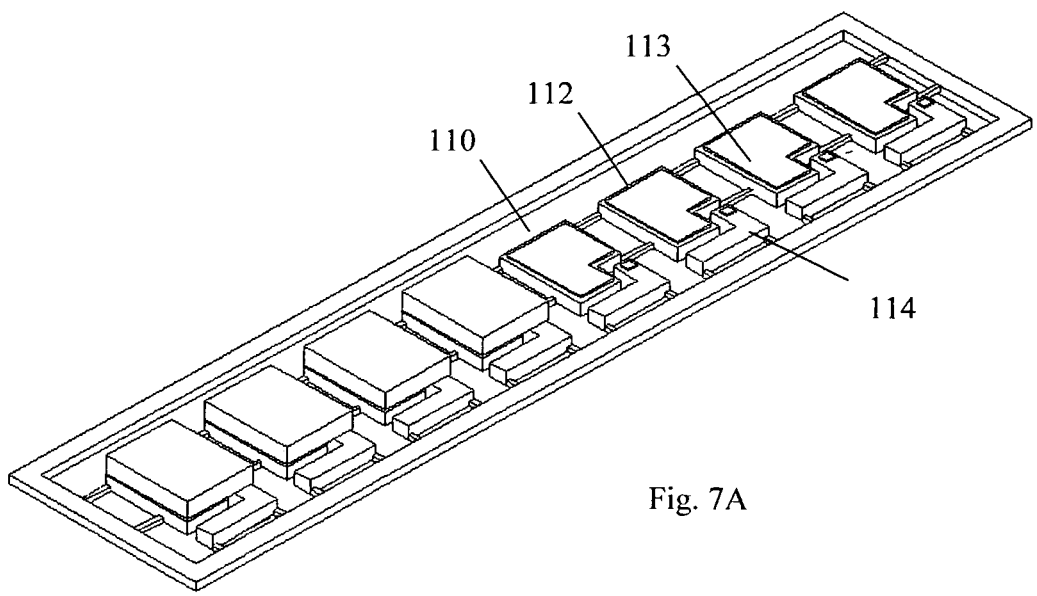
FIGS. 7A to 7C are a serial of perspective views for showing an alternate preferred manufacturing process of a strip of power device package of this invention.
Figure 7B:
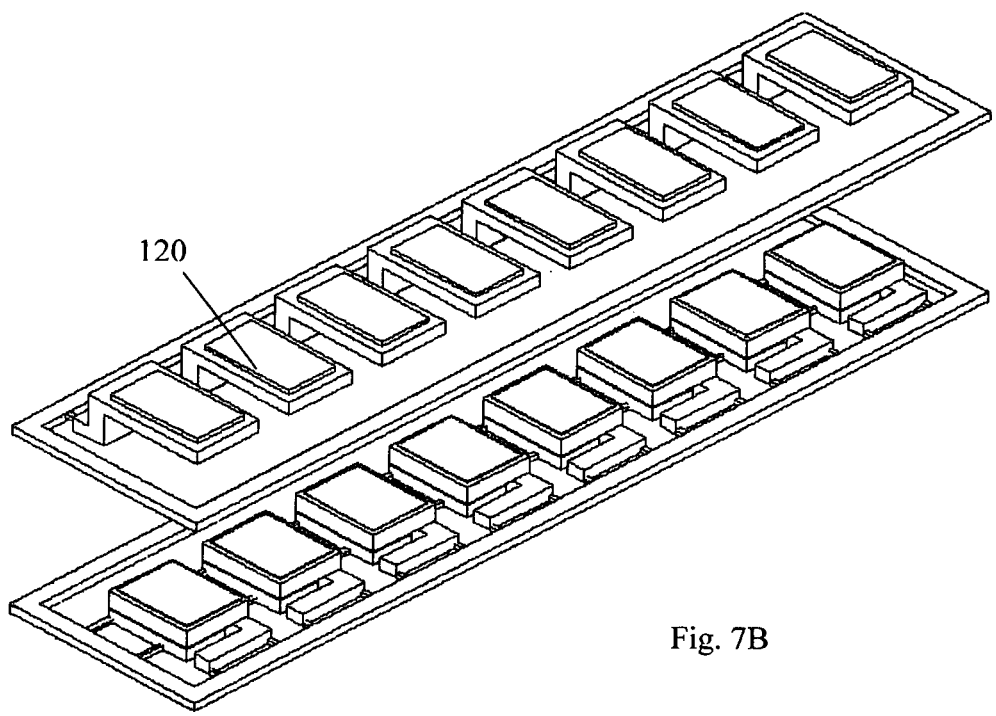
Figure 7C:
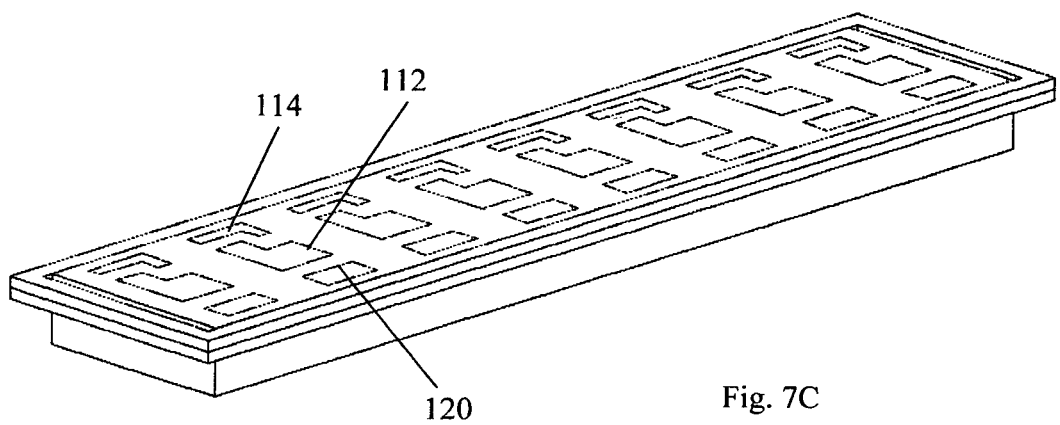

Referring to FIGS. 7A to 7C for a second method to package a strip of MOSFET power devices implemented with packaging configuration as described above. In FIG. 7A, a strip of bottom lead-frame 110 for contacting the gate contact 114 and source contact 112 of a MOSFET chip 105 is placed on a die attachment machine, e.g., a die bonder (not show). A layer of conductive epoxy/adhesive, solder 108 is deposited on top of the top surface of the chip-pads as part of the lead frame 120. The chip then place onto the supporting pad and attached to the lead frame through soldering, carbon paste local heating by ultrasonic energy with a bottom application method. In another embodiment no epoxy/adhesive or solder, carbon paste is used, the die is attached to the lead frame through direct metal melting joint by ultrasonic local heating. In FIG. 7B, a top lead frame 120 that includes contacts for drain 120 is placed to top to contact the drain of the chip 105. The top lead frame 120 is attached to the chip by applying ultrasonic energy for local heating or by use of epoxy/adhesive, soldering or carbon paste processes. FIG. 7C is the same as FIG. 6C, shows a bottom view of a strip of power chip package onto the top and bottom lead frames by applying the processes described above with gate contact 114, source contact 114 and drain contact 120 exposed and ready for mounting and implementation into circuits for various applications.

Figure 8A:
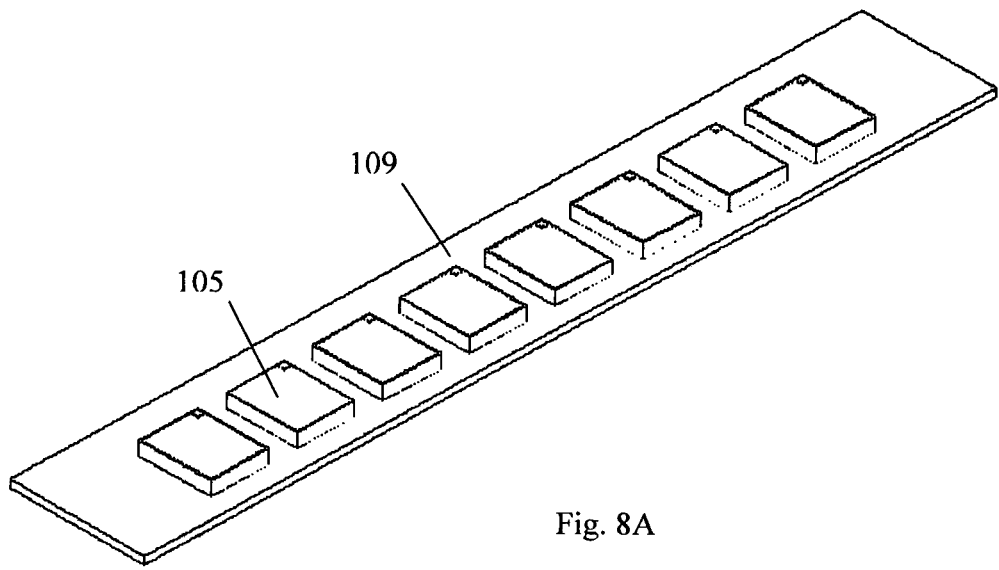
FIGS. 8A to 8C are a serial of perspective views for showing an alternate preferred manufacturing process of a strip of power device package of this invention.
Figure 8B:
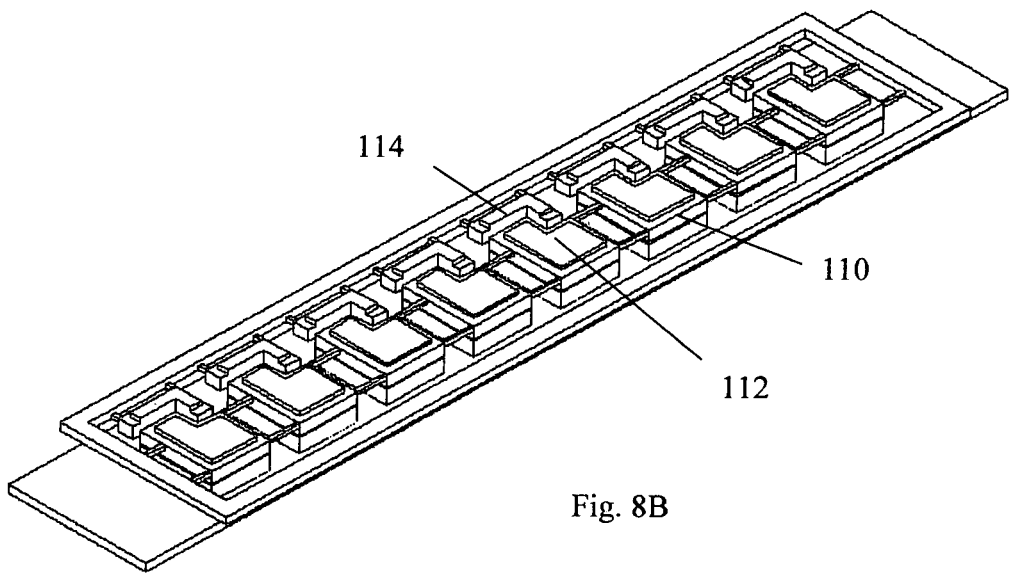
Figure 8C:
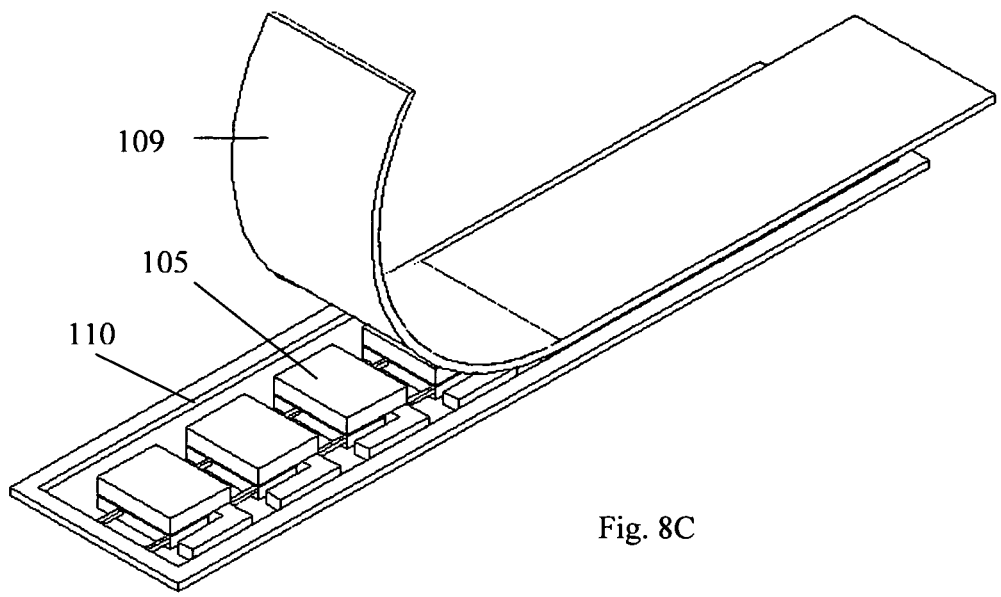
Figure 9:
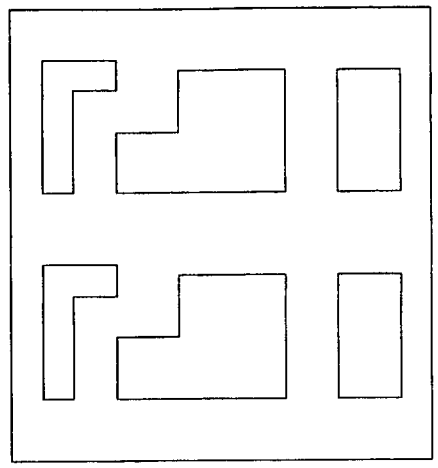
FIGS. 9 to 13 are several alternate bottom view of different arrangement of electrodes of the power device package of this invention.
Figure 10:
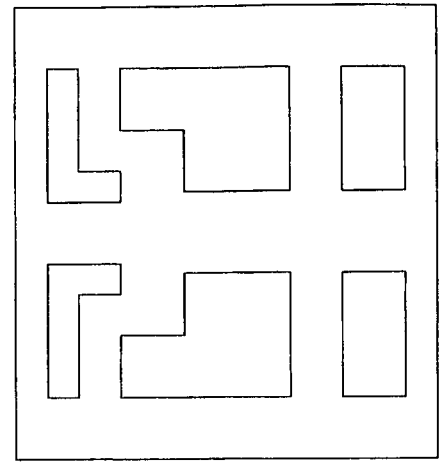
Figure 11:
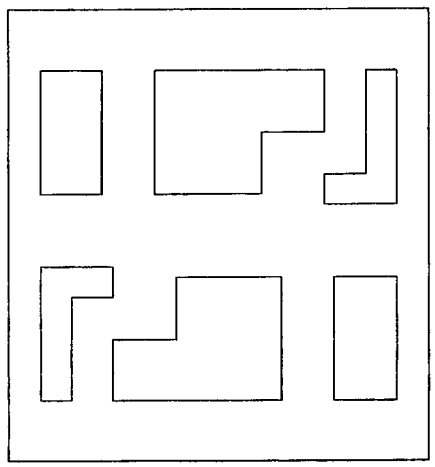
Figure 12:
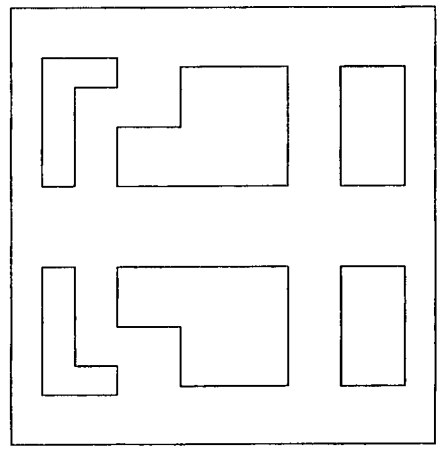
Figure 13:
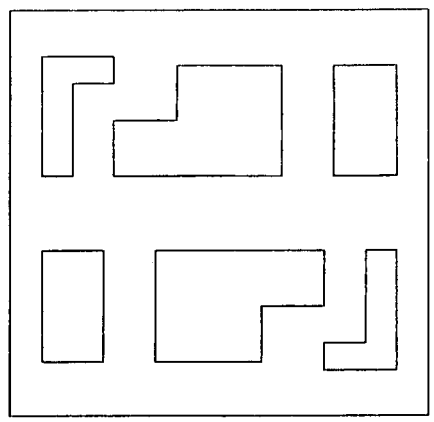

Referring to FIGS. 8A to 8C for a third method to package a strip of MOSFET power devices implemented with packaging configuration as described above. In FIG. 8A, the die 105 is placed onto the UV film topped strip 109, made by stainless steel or hard plastics, according to the dies pitch. In FIG. 7B, the whole strip of bottom lead frame 110 with source contact 112 and gate contact 114 is attached onto dies through top ultrasonic energy apply, locally heating, conductive epoxy/adhesive, soldering, carbon paste etc. In FIG. 8C above source and gate lead frame 110 is flipped to peer off UV film 109 topped strip from above dies surface. The process followed by the attachment of the top frame 120 (same as that shown in FIG. 7B) to complete the packaging process for assembling a strip of power devices (same as FIGS. 6C and 7C).

The above descriptions of manufacturing methods summarize the process flows to assemble the package as preferred embodiments of the invention, which are different from current chip attachment and bonding processes. With these new methods and configurations, power MOSFET packages can be cost effectively processed depending on the electrical, mechanical and chemical requirements and availability of assembly lines.

By applying the above processing steps, the package structure can also be extended to multi-chips applications with a combination of above cell structure, for example, two chips and multiple chips packages etc. as showed in the FIGS. 9~13. With some modifications on the lead frame strip it is also possible to arrange the bottom lead frame in 90 degree with the top lead frame. The selection of top and bottom lead frame materials is a result of considering package and chip top and bottom surfaces metallurgy, thermal expansion, and electrical, mechanical and chemical requirements.

Compared to current flip chip packaging technologies, this invented package has much better electrical and mechanical properties, while its cost is much lower. This technology eliminates the requirement of gold bump, solder bump as interconnects in conventional flip chip technologies. All of chip surfaces of source, gate and grain have been fully jointed and covered by conductive lead frame to receive the lowest resistance and inductance though maximized cross sectional area and the shortest joint area for conduction between die and lead frame. Especially in the case of ultrasonic bonding between lead frame and chip, the lead frame has been directly jointed to chip source, gate and grain without any third party involved. The invention not only eliminates the gold bump or solder bumping process requirement of current flip chip process technologies, but also eliminates the requirement of bumping associated processes and materials, for example, underfill. From the point of view of resistance and inductance in both of package and board levels, this technology is sitting on the unbeatable position compared to other existing flip chip technologies, such as ball grid array (BGA), gold bump or CSP, and wire bonding technologies. In terms of reliability points of view, the technology possesses much more reliable component and board level connections than those of other existing flip chip technologies using any type of bumps because this invention has larger available join area and mechanical and chemical strengths.

Compared to current wire bonding, ribbon or tape or plate bonding technologies for gold, aluminum and copper etc materials, this invention also has much better electrical and mechanical properties, such as electrical resistance, inductance, mechanical strength and reliability. Furthermore, this invention also eliminates these sophisticated processes and use of expensive wire or ribbon materials so that the invented package has better position in component price and board level assembly cost. The simplified assembly process has increased the assembly productivity through units per hour (UPH) for whole assembly line compared to current flip chip technologies and wire, ribbon or tape or plate bonding technologies. This invention can be used to replace most of existing power device related packages including wire bonding, ribbon or tape or plate bonding, BGA flip chip, CSP, Clip bonding, etc. to reduce manufacture costs, increase product reliability and improve device performance.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

The invention claimed is:

1. A power device package comprising:
   a power transistor formed as an integrated circuit (IC) chip on a semiconductor die wherein the IC chip having a top flat-surface die electrode and at least a bottom flat-surface die electrode wherein the power device package further containing, protecting and providing electrical contacts for the IC chip;

the power device package further comprising a top metal plate directly contacting substantially a majority area of the top flat-surface die electrode for directly soldering to said top flat-surface die electrode of the IC chip as a top metal-surface-soldered-to-metal-surface attachment without any intermediate bonding or attachment layer between the top metal plate and the top flat-surface die electrode; and the power device package further comprising a bottom metal plate directly contacting substantially a majority area of the bottom flat-surface die electrode for directly soldering to said bottom flat-surface die electrode of the IC chip as a bottom metal-surface-soldered-to-metal-surface attachment without any intermediate bonding or attachment layer between the bottom metal plate and the bottom flat-surface die electrode.

2. The power device package of claim 1 wherein:
said power transistor is packaged as a flip-chip in said power device package wherein said bottom flat-surface die electrode comprises a flat-surface source metal contact and a flat-surface gate metal pad and wherein the bottom flat-surface die electrode is attached directly to said bottom metal plate as said-bottom metal-surface-soldered-to-metal-surface attachment without any intermediate bonding or attachment layer between the bottom metal plate and the flat-surface source metal contact and the flat-surface gate metal pad.

3. The power device package of claim 2 wherein:
said bottom metal plate further comprising a source portion with a first step up flat-surface area for soldering directly to said flat-surface source metal contact and a gate portion with a second step up flat-surface area for soldering directly to said flat-surface gate metal pad.

4. The power device package of claim 1 wherein:
said top flat-surface die electrode of the IC chip a flat-surface drain contact metal of the power transistor attached directly to said top metal plate as-said top metal-surface-soldered-to-metal-surface attachment without any intermediate bonding or attachment layer between the top metal plate and the flat-surface drain contact metal.

5. The power device package of claim 1 wherein:
said top metal-surface-soldered-to-metal-surface attachment between the top flat-surface die electrode and the top metal plate further comprises a top metal melting joint surface; and
said bottom metal-surface-soldered-to-metal-surface attachment between the bottom flat-surface die electrode and the bottom metal plate further comprise a bottom metal melting joint surface.

6. The power device package of claim 1 wherein:
said top and bottom metal plates comprise a top aluminum plate and a bottom aluminum plate respectively.

7. The power device package of claim 1 wherein:
said top and-bottom metal plates comprise a top copper plate and a bottom copper plate respectively.

8. The power device package of claim 1 wherein:
said top and-bottom metal plates comprise a top nickel plate and a bottom nickel plate respectively.

9. The power device package of claim 1 wherein:
said top and-bottom metal plates comprise a top and bottom aluminum plates respectively and said top flat-surface die electrode and bottom flat-surface die electrode of said power transistor comprise a top flat surface aluminum die electrode and a bottom flat surface aluminum die electrode respectively.

10. A power device package comprising:
multiple power transistors each is formed as an integrated circuit (IC) chip on a semiconductor die wherein the IC chip and each having a top flat-surface die electrode and at least a bottom flat-surface die electrode wherein the power device package containing, protecting and providing electrical contacts for the multiple power transistors configured as the IC chips;

the power device package further comprising a set of top metal plates each directly contacting substantially a majority area of the top flat-surface die electrode for directly soldering to one of said top flat-surface die electrodes of the IC chips as top metal-surface-soldered-to-metal-surface attachments without any intermediate bonding or attachment layer between the top metal plates and the top flat-surface die electrodes; and the power device package further comprising a set of bottom metal plates each directly contacting substantially a majority area of the bottom flat-surface die electrode for directly soldering to one of said bottom flat-surface die electrodes of the IC chips as a bottom metal-surface-soldered-to-metal-surface attachments without any intermediate bonding or attachment layer attachment layer between the bottom metal plates and the bottom flat-surface die electrodes.

11. The power device package of claim 10 wherein:
each of said power transistors is packaged as a flip-chip in said power device package wherein each of said bottom flat-surface die electrodes comprises a flat-surface source metal contact and a flat-surface gate metal pad and wherein each of the bottom flat-surface die electrodes is attached directly to said bottom metal plates as said-bottom
metal-surface-soldered-to-metal-surface attachment without any intermediate bonding or attachment layer between the bottom metal plates and the flat-surface source metal contacts and the flat-surface gate metal pads.

12. The power device package of claim 11 wherein:
each of said bottom metal plates further comprising a source portion with a first step up flat-surface area soldering directly to one of said flat-surface source metal contacts and a gate portion with a second step up flat-surface area for soldering directly to said flat-surface gate metal pad.

13. The power device package of claim 10 wherein:
the top flat-surface die electrode of each of said IC chips having a flat-surface drain contact metal of the power transistors attached directly to said top metal plates as-said top metal-surface-soldered-to-metal-surface attachments without any intermediate bonding or attachment layer between the top metal plates and the flat-surface drain contact metal.

14. The power device package of claim 10 wherein:
said set of top meal plates and bottom metal plates comprise a set of top copper plates and a set of bottom copper plates respectively.

15. The power device package of claim 10 wherein:
said set of top meal plates and bottom metal plates comprise a set of top and a bottom aluminum plates respectively and said top flat surface die electrodes and-bottom surface die electrodes of said power transistors comprise top flat surface aluminum electrodes and bottom flat surface aluminum electrodes respectively.

16. The power device package of claim 10 wherein:
said set of top metal plates and said set of bottom metal plates comprise a set of top aluminum plates and a set of bottom aluminum plates respectively.

17. The power device package of claim 10 wherein:
said top metal-surface-soldered-to-metal-surface attachments between the top flat-surface die electrodes and the top metal plates further comprises top metal melting joint surfaces; and
said bottom metal-surface-soldered-to-metal-surface attachments between the bottom flat-surface die electrodes and the bottom metal plates further comprise bottom metal melting joint surfaces.

18. A power device package comprising:
a power transistor formed as an integrated circuit (IC) chip on a semiconductor die wherein the IC chip having a to flat-surface die electrode and at least a bottom flat-surface die electrode wherein the power device package containing, protecting and providing electrical contacts for the power transistor;
the power device package further comprising a top metal plate contacting substantially a majority area of the top flat-surface die electrode for directly soldering to said top flat-surface die electrode of the power transistor as a top metal-surf ace-soldered-to-metal-surface attachment without any intermediate bonding or attachment layer between the top metal plate and the top flat-surface die electrode;
the power device package further comprising a bottom metal plate directly contacting substantially a majority area of the bottom flat-surface die electrode for directly soldering to said bottom flat-surface die electrode of the power transistor as a bottom metal-surface-soldered-to-metal-surface attachment without any intermediate bonding or attachment layer between the bottom metal plate and the bottom flat-surface die electrode;
said power transistor is packaged as a flip-chip in said power device package wherein said bottom flat-surface die electrode comprises a flat-surface source metal pad and a flat-surface gate metal pad and wherein the bottom flat-surface die electrode is attached directly to said bottom metal plate as-said-bottom metal-surface-soldered-to-metal-surface attachment without any intermediate bonding or attachment layer between the bottom metal plate and the flat-surface source metal contact and the flat-surface gate metal pad
said top metal plate further comprising a step-up platform structure for directly attaching to a flat-surface drain pad; and
said bottom metal plate further comprising a source portion with a first step up platform and a gate portion with a second step up platform configured to match and directly solder to the flat-surface source contact metal and the flat-surface gate metal pad respectively.

* * * * *